United States Patent [19]

Sibley et al.

[11] 3,959,763
[45] May 25, 1976

[54] FOUR TERMINAL VARISTOR
[75] Inventors: Henry C. Sibley, Adams Basin, N.Y.; Willis R. Smith, Johannesburg, South Africa
[73] Assignee: General Signal Corporation, Rochester, N.Y.
[22] Filed: May 17, 1975
[21] Appl. No.: 569,046

[52] U.S. Cl. ............................... 338/21; 338/325
[51] Int. Cl.² ........................................ H01C 7/12
[58] Field of Search ............. 338/20, 21, 324, 325, 338/322; 317/31, 33

[56] References Cited
UNITED STATES PATENTS

| | | | |
|---|---|---|---|
| 2,935,712 | 5/1960 | Oppenheim et al. | 338/325 X |
| 3,195,091 | 7/1965 | Kujawa et al. | 338/20 X |
| 3,271,591 | 9/1966 | Ovshinsky | 340/173 X |
| 3,324,531 | 6/1967 | Hiatt | 338/20 X |
| 3,727,165 | 4/1973 | Hagen | 338/20 |
| 3,742,419 | 6/1973 | Martzloff | 338/20 |
| 3,754,200 | 8/1973 | Harnden | 338/20 |

Primary Examiner—C. L. Albritton
Attorney, Agent, or Firm—Milton E. Kleinman; George W. Killian

[57] ABSTRACT

A four terminal varistor is shown as a device for providing fail-safe circuit protection under certain conditions. The failure of any lead connected to the four terminal varistor will shut down the protected load so that the load cannot operate under unsafe conditions. By its nature, a varistor can absorb voltage peaks and protect a load from high voltage and/or a current resulting from high voltage. One pair of leads from the varistor is connected to the power supply and the other pair of leads to the load. Thus, if any lead is broken, there will be no power to the load. A variation provides additional protection in the event the metal coating on the semiconductor, to which two of the leads are attached, becomes detached from the semiconductor. In case of such detachement, the electrical connection between the two leads is broken. For this purpose, the metalized coating on the semiconductor is divided into two separate areas, one for each lead. The areas are electrically coupled together by a mechanically weak link and/or a link which may be embedded within the semiconductor material.

11 Claims, 7 Drawing Figures

FOUR TERMINAL VARISTOR

BACKGROUND OF THE INVENTION

A varistor is a semiconductor device having a voltagedependent nonlinear resistance. A varistor performs in a manner similar to back-to-back zener diodes in a circuit. When a varistor is exposed to high energy voltage transients, the varistor impedance changes from a very high standby value to a very low conducting value, thus clamping the transient voltage to a safe level. Because of this characteristic, varistors may be used to absorb voltage peaks and protect a load which might be damaged by voltage peaks.

Prior art varistors have served admirably as protection devices. However, if a circuit intended to include a varistor does not in fact include the varistor, or if a varistor is included but the wiring to it is incomplete or has gone open, there will be no protection for the load and there will be no indication that the protective device is missing and/or inoperative. For this reason, a standard two terminal varistor connected in the normal fashion does not constitute a "fail-safe" device.

SUMMARY OF THE INVENTION

The present invention comprises a multi-terminal varistor device which may be connected in a circuit to provide circuit protection equal to that provided by a two terminal varistor, but which will provide an indication if the element is missing and/or if any connection thereto is incomplete or defective. In its simplest form, the invention comprises a semiconductor material similar to that used in prior art varistors, and having two areas of contact metalization coupled thereto. In a typical application, the two areas of contact metalization will be on opposite faces of the semiconductor material. To each area of contact metalization will be connected two separate and distinct terminals. One terminal from each contact metalization area will be connected to the power supply while the other terminal from each area will be connected to the load. If any connection from either area should be incomplete, or go open, the power supply will not be connected to the load and there will be an indication of failure.

An alternate form of the invention provides for a four terminal varistor which will provide fail-safe characteristics in the event that the contact metalization area becomes mechanically separated from the semiconductor material. If the area should become separated, it will be apparent that the varistor has failed, but that, as thus far described, power will still be connected to the load. To provide fail-safe characteristics in the event that the contact metalization area becomes disconnected from the semiconductor material, the contact metalization area may be made in two distinct segments which are electrically joined by a mechanically weak link. The link may comprise a conductor embedded in the semiconductor material. The embedded conductor may electrically couple area segments which are on the same face of the semiconductor material, or the embedded conductors may couple areas which are not on the same face of the semiconductor material.

In summary, the invention comprises a varistor including a semiconductor element which has a voltage dependent nonlinear resistance and which has first and second metalized faces bonded to the semiconductor and with first and second terminals coupled to each of said faces. An appropriate pair of the terminals is connected to a power supply and the other pair of terminals is connected to the load.

It is an object of the invention to provide a new and improved varistor element.

It is a more specific object of the invention to provide a new and improved varistor having a plurality of terminals.

It is an even more specific object of the invention to provide a varistor which will give a circuit indication if it is open circuited.

It is another object of the invention to provide a four terminal varistor which will disconnect a load from a power supply if any one of the leads should be open circuited.

It is another object of the invention to provide a four terminal varistor which will provide load protection if the metallized area bonded to the semiconductor material should become mechanically separated from the semiconductor material.

It is another object of the invention to provide a four terminal varistor having a plurality of metalized areas bonded to the semiconductor material and having selected ones of said areas electrically coupled by a link which is mechanically weak.

It is another object of the invention to provide a varistor device having a plurality of metalized areas bonded to the semiconductor material with some of said areas electrically bonded by conducting means embedded in the semiconductor material.

Other and more specific objects of the invention will become apparent to those skilled in the applicable arts as the following specification is considered together with the drawing and claims.

DESCRIPTION OF THE PREFERRED EMBODIMENT

Two terminal varistors are commercially available and their characteristics and functions in circuits are known to those skilled in the applicable arts. Briefly, varistors are voltage dependent symetrical resistors which perform in a manner similar to back-to-back zener diodes to provide circuit protective functions. When a varistor is exposed to high energy voltage transients, the varistor impedance changes from a very high standby value to a very low conducting value, thus clamping the transient voltage to a safe level. The dangerous energy of the incoming high voltage pulse is absorbed by the varistor, thus protecting the voltage sensitive load. Briefly, the voltage and power handling capabilities of a varistor depend upon various characteristics including composition of the semiconductor material, density of the semiconductor material and size or volume of the semiconductor material. More detail concerning the characteristics and capabilities of varistors may be obtained from the manufacturers thereof including the General Electric Company.

Figure 6:
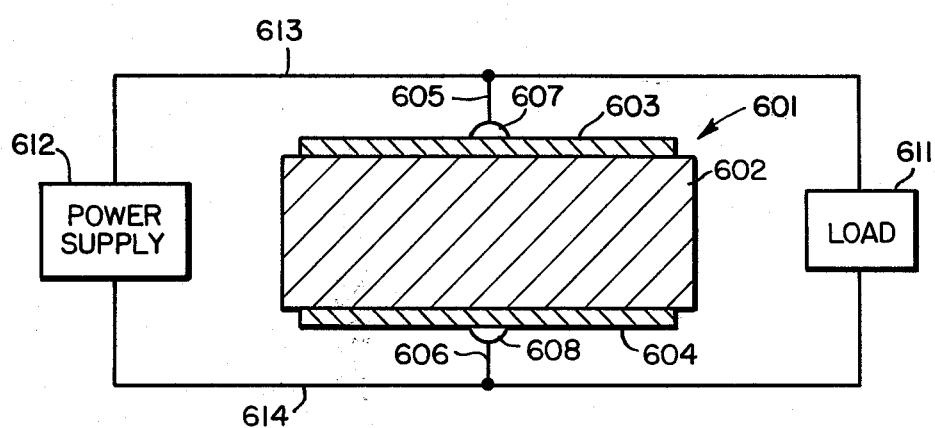
FIG. 6 illustrates a circuit employing a prior art varistor.

FIG. 6 illustrates a typical prior art varistor and its application. The varistor indicated generally as 601 comprises a body 602 of polycrystalline semiconductor composed of crystals and associated grain boundaries all as more fully described in textbooks and manufacturers' publications. The structure of the body 602 does not form a part of the present invention and need not be disclosed here in more complete detail. It is the body 602 of the varistor 601 which has the capability, when exposed to high energy voltage transients, of changing from a very high standby impedance to a very low conducting impedance. In order to make electrical contact to the body 602, opposite faces thereof are provided with metalized surfaces 603 and 604 to which leads 605 and 606 may be attached by some convenient means such as globules of solder 607 and 608. The varistor 601 may be used in a circuit to limit the voltage applied to a load 611 which may be damaged if the voltage exceeds a predetermined value. For the purposes of this illustration, it will be assumed that the varistor 601 has been appropriately selected to provide the desired protection. A power supply 612 is coupled to the load 611 by conductors 613 and 614. Coupled between the conductors 613 and 614 is the varistor 601 with the lead 605 coupled to the conductor 613 and the lead 606 coupled to the conductor 614. If a spike of voltage originating from the power supply 612, or any other source, appears across leads 613 and 614 and exceeds that which should be applied to the load 611, the potential will appear at leads 605 and 606 of the varistor 601 and this higher potential will cause the semiconductor material 602 of the varistor 601 to assume a greatly reduced impedance value and thereby prevent the application of the voltage spike to the load 611.

If during the assembly of the circuit of FIG. 6 the varistor 601 was omitted, or if the connections of the leads 605 and 606 to the leads 613 and 614, respectively, were not completed, the varistor 601 could not provide the desired protection. The lack of the desired protection probably would not be discovered until components within the load 611 had been damaged as a result of a voltage spike generated by the power supply 612 or any other source. The varistors of the remaining figures are designed to overcome the shortcomings described with respect to FIG. 6.

Figure 1:
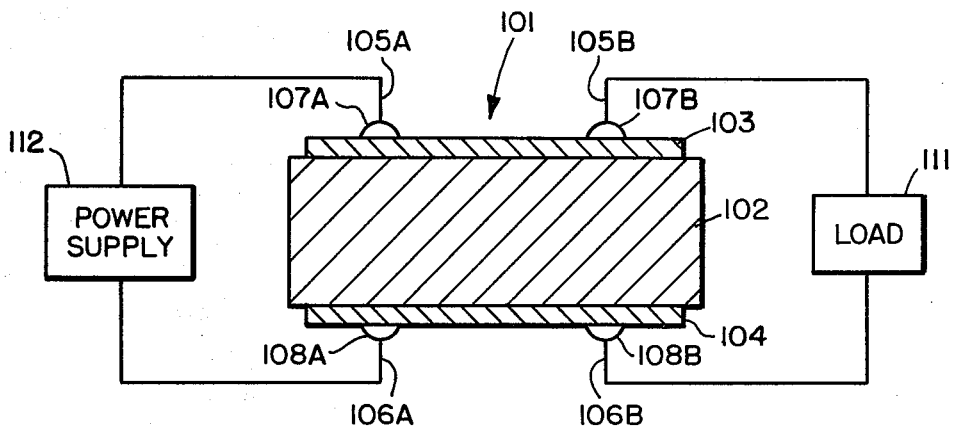
FIG. 1 is a cross-sectional view of a four terminal varistor showing connections to a power supply and a load.

Considering now more specifically the circuit of FIG. 1, there will be seen a varistor indicated generally as 101 and having a body 102. Coupled to opposite faces of the body 102 are metalized surfaces 103 and 104 which provide means for making electrical connections to the body 102. Coupled to the metalized surface 103 are leads 105A and 105B; and coupled to the metalized surface 104 are leads 106A and 106B. The leads just mentioned are electrically connected to their respective metalized surfaces by solder globules 107A, 107B and 108A and 108B. The varistor 101 may now be coupled between a load 111 and a power supply 112 by connecting the leads 105A and 106A to the power supply 112 while the leads 105B and 106B are connected to the load 111. Power from the power supply 112 is conducted through the lead 105A the solder globule 107A, the metalized surface 103, the solder globule 107B and the wire 105B to the load 111. The other side of the power supply 112 is connected to the load 111 through a similar circuit including lead 106A, solder globule 108A, metalized surface 104, solder globule 108B and lead 106B. It will be apparent that omission of the varistor 101 from the circuit of FIG. 1 will absolutely and totally immobilize the circuit in that no power from the power supply 112 can be applied to the load 111 unless the varistor 101 is properly connected in the circuit. Furthermore, if any one or more of the leads 105A, 105B, 106A or 106B should become open circuited there will be a complete immobilization of the load 111. Accordingly, there is no chance that a voltage spike from power supply 112, or any other source, can be applied to the load 111 as a result of a missing varistor 101 or improperly completed connections. The power supply 112, or the equivalent in any other circuit, would normally be equipped with a current limiting resistor, not shown.

There is the remote possibility that one or the other, or both, of the metalized surfaces 103 and 104 may separate from the varistor body 102. While such mechanical separation may be improbable, it remains as a possibility and if such separation should occur, the load 111 would be unprotected against power spikes. That is, if one or both of the metalized plates 103 and/or 104 become mechanically separated from the body 102 and a voltage spike appears across the metalized plates 103 and 104, the body 102 cannot respond and protect the load 111 in the customary manner. Alternate forms of the invention shown in the remaining figures will protect the load against this hazard.

Figure 2:
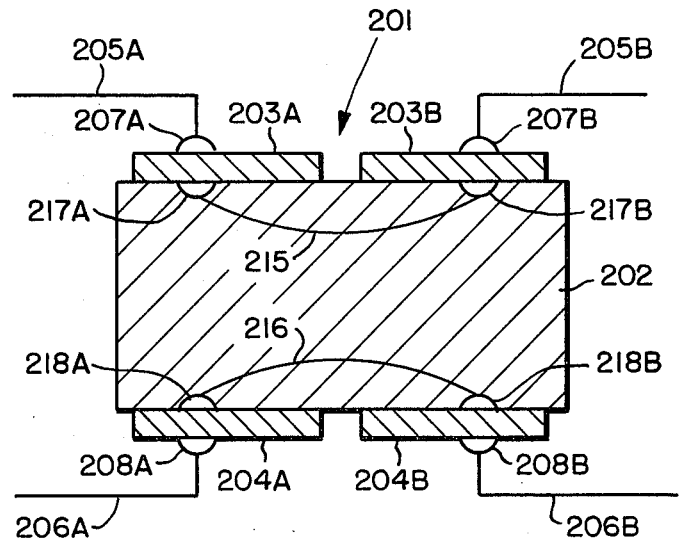
FIG. 2 is a cross-sectional view of an alternate form of a four terminal varistor and showing embedded electrical connections.

Considering now more specifically the varistor 201 of FIG. 2, it should be understood that this varistor could serve as a direct substitution for the varistor 101 of FIG. 1. Accordingly, the varistor 201 is not shown as coupled to a power supply and load inasmuch as these connections would be identical to those for the varistor 101. The varistor 201 includes a body 202 and leads 205A, 205B, 206A and 206B as well as solder globules 207A, 207B, 208A and 208B all of which function in a manner identical to that described for the corresponding elements of FIG. 1. Corresponding elements of FIG. 1 and FIG. 2 have been given identical identification numbers except for the first digit which corresponds to the figure number.

The varistor 201 does not include a metalized surface that corresponds identically with the metalized surface 103 and/or 104 of FIG. 1. More specifically, it will be seen that the varistor 201 includes a pair of metalized surfaces 203A and 203B and another pair 204A and 204B. The pairs of metalized plates 203A and 203B are coupled together by electrical conducting means 215 which is embedded in the body 202. In a similar manner, the metalized surfaces 204A and 204B are electrically coupled together by electrical conducting means 216 which is embedded in the body 202. The conducting means 215 is bonded to the metalized plate 203A by some suitable means 217A and it is coupled to the metalized surface 203B by means 217B. In a similar manner, the electrical conducting means 216 is coupled at its ends to metalized surfaces 204A and 204B by coupling means 218A and 218B, respectively.

The varistor 201 is the electrical equivalent of the varistor 101. However, with the varistor 201, it will be seen that if a mechanical separation should take place between one or more of the metalized surfaces 203A, 203B, 204A and 204B and the body 202, the load and the power supply will be disconnected. This presumes that the undesired and inadvertent mechanical separation of the metalized surfaces 203A etc. will separate not only from the body 202, but also from the respective couplings 217, 218 and the conducting means 215, 216 as may be applicable. That is, as a matter of design criteria, the metalized surfaces 203A etc. should not separate from the body 202; but if such separation should occur, the design should be such that separation will also take place between the metalized surface 203A etc, and the corresponding coupling 217A etc.

Accordingly, there has been shown in FIG. 2 a varistor 201 which may be substituted for the varistor 101 which has all the advantages of the varistor 101 plus the advantage that a mechanical separation of the metalized surface 203A etc. from the body 202 will disconnect the load and protect it from undesirable voltage spikes. To further ensure load protection, consideration should be given to the varistor design, construction and connection so that there is negligible probability of contact between surfaces 203A and 203B if one or both should separate from the body 202.

Figure 3A:
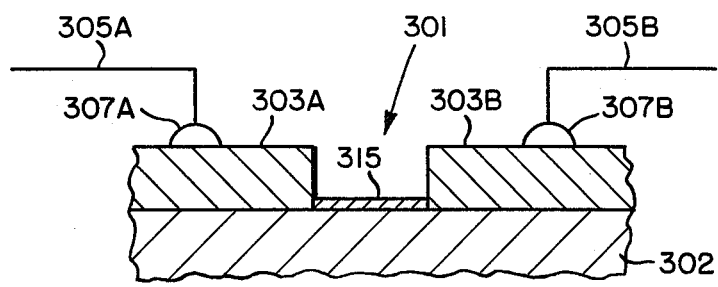
FIG. 3A is a fragmentary cross-section view of an alternate form of the invention employing a mechanically weak link.
Figure 3B:
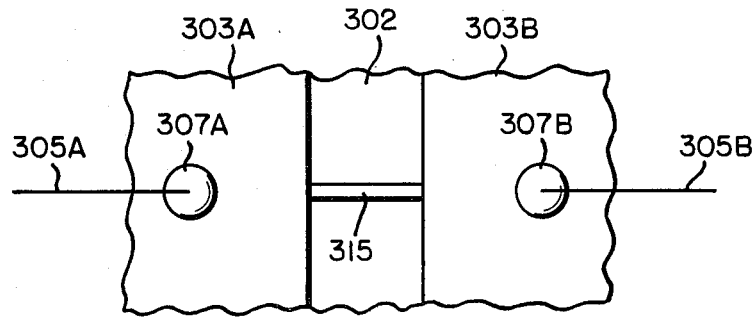
FIG. 3B is a top view of the fragment shown in FIG. 3A.

Considering now more specifically FIGS. 3A and 3B, there will be seen therein two views of a portion of a varistor 301 which may be substituted for the varistor 201 and which has all the advantages of the varistor 201, but which has a slightly different structure. Parts of the varistor 301 which correspond with parts of the varistor 201 have been given identifying numbers which are similar except for the first digit.

The principal difference between the varistors 201 and 301 resides in the means for electrically coupling the metalized surfaces 303A and 303B. Instead of using embedded connections as shown with respect to varistor 201, the varistor 301 employs a link 315 which electrically couples the surfaces 303A and 303B and which is of the minimum size required for conducting the required current from surface 303A to surface 303B. Accordingly, if either of the metalized surfaces 303A and/or 303B should become mechanically separated from the body 302, the link 315 will be mechanically ruptured and thereby disconnect the power source from the load.

Figure 4:
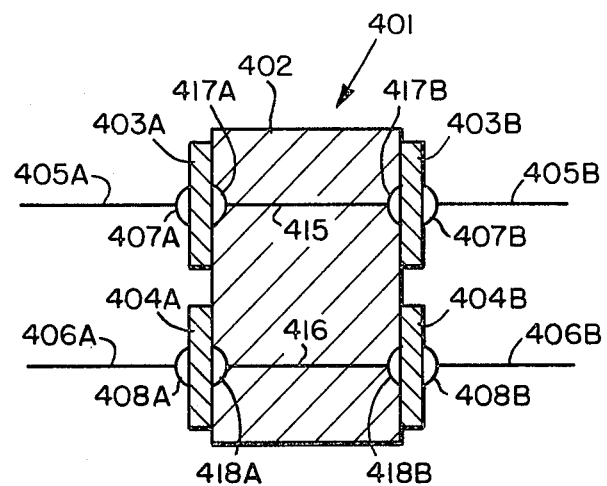
FIG. 4 is a cross-sectional view of an alternate form of a four terminal varistor.

FIG. 4 illustrates a varistor 401 which is another variation on the varistor 201 of FIG. 2. For convenience, the elements of the varistor 401 which correspond with equivalent elements of the varistor 201 have been given identifying numbers which are identical except for the first digit. The principal difference between the varistors 201 and 401 will be seen to reside in the fact that the electrically coupled metalized surfaces 403A and 403B do not reside on a common surface of the body 402. In a similar manner, the metalized surfaces 404A and 404B are on opposite faces of the body 402. The structure of FIG. 4 offers advantages and features similar to those provided by the varistor 201 of FIG. 2.

Figure 5:
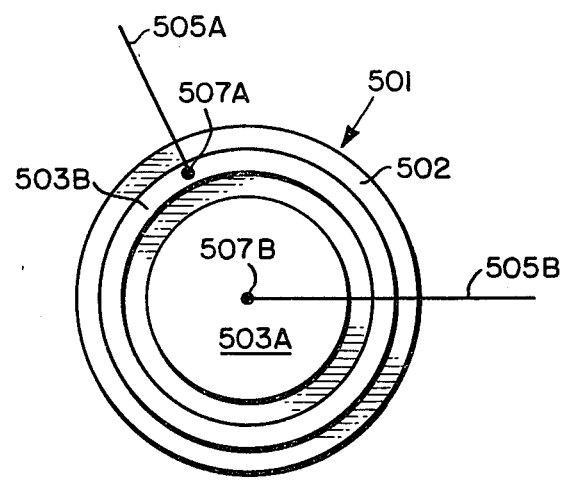
FIG. 5 is a top view of another alternate form of a four terminal varistor.

It should be recognized that the metalized surfaces 203A, 303A and 403A etc. may take any convenient geometrical configuration. For example, they may be round, semicircular, oval, rectangular or irregular in shape. For example, as shown in FIG. 5, which illustrates a top view of another varistor 501, it will be seen that the metalized surface 503A and 503B, which correspond respectively to surfaces 203A and 203B of FIG. 2 are in the form of a circle and a concentric ring, respectively. The underside of the varistor 501 could be similar to the top shown in FIG. 5. The electrical coupling between surfaces 503A and 503B could be an embedded coupling as shown in FIG. 2 and represented by the conducting means 215; or it could be a link similar to the link 315 shown in FIG. 3. Neither type of coupling is specifically illustrated in FIG. 5.

The varistors of the present invention may be enclosed in metal containers or glass containers or potted or otherwise treated in any conventional manner for housing electrical components. However, as already indicated, full assurance of load protection is not assured unless care is taken to reduce the probability of inadvertent contact between the leads corresponding to 105A, 105B, 106A and 106B.

While there has been shown and described what is considered at present to be the preferred embodiment of the invention, modifications thereto will readily occur to those skilled in the related arts. For example, in a similar structure, it might be desirable to have a greater plurality of metalized surfaces and/or external contact to the varistor might be made by contact fingers or springs rather than by soldered connections. It is believed that no further analysis or description is required and that the foregoing so fully reveals the gist of the present invention that those skilled in the applicable arts can adapt it to meet the exigencies of their specific requirements. It is not desired, therefore, that the invention be limited to the specific embodiments shown and described, and it is intended to cover in the appended claims all such modificiations as fall within the true spirit and scope of the invention.

What is claimed is:

1. A varistor comprising in combination:
   a. a body having a voltage dependent nonlinear impedance; and
   b. first and second pairs of electrical contact means coupled to first and second metalized areas, respectively, bonded to said body for providing for electrical connections between said body and external components.

2. The combination as set forth in claim 1, wherein each of said first and second metalized areas are subdivided into first and second segments joined by a link and wherein each of said contact means is coupled to an individual one of said segments.

3. The combination as set forth in claim 2, wherein said link is embedded in said body.

4. The combination as set forth in claim 2, wherein the electrical connection formed by said link joining a pair of segments will be broken in response to a mechanical stress which breaks the bond between either or both of the segments and said body.

5. A varistor comprising in combination:
   a. a semiconductor having a voltage dependent nonlinear impedance;
   b. first and second metalized faces having linear impedance bonded to said semiconductor for making electrical connections thereto; and wherein
   c. said first and second metalized faces comprise first and second segments joined by a conductive link for extending individual electrical connections from each of said segments to external components.

6. The combination as set forth in claim 5, wherein the conduction between said first and second segments will be broken in response to either, or both, of said first and second segments losing their bond to said 7. The combination as set forth in claim 6, wherein said link is embedded in said semiconductor.

8. A semiconductor device comprising in combination:
   a. a body having a voltage dependent nonlinear impedance;
   b. first and second pairs of opposed metalized faces having linear impedance and coupled to said body for making electrical contact therewith;
   c. terminal means coupled to each of said faces for electrically connecting each of said faces to external components; and
   d. first and second linear impedance coupling means for electrically coupling the faces of said first and second pairs of faces, respectively.

9. The combination as set forth in claim 8 and including first and second coupling means for electrically coupling the faces of said first and second pairs of faces, respectively.

10. The combination as set forth in claim 9, wherein said coupling means is coupled to the opposite sides of said faces from that to which said terminal means is coupled.

11. The combination as set forth in claim 10, wherein said coupling means is embedded in said semiconductor material.

* * * * *